United States Patent [19]

Takemae et al.

[11] Patent Number: 4,740,926
[45] Date of Patent: Apr. 26, 1988

[54] SEMICONDUCTOR MEMORY DEVICE

[75] Inventors: Yoshihiro Takemae, Tokyo; Masao Nakano, Kawasaki; Kimiaki Sato, Tokyo; Nobumi Kodama, Kawasaki, all of Japan

[73] Assignee: Fujitsu Limited, Kanagawa, Japan

[21] Appl. No.: 843,356

[22] Filed: Mar. 24, 1986

[30] Foreign Application Priority Data

Apr. 5, 1985 [JP] Japan ................................. 60-071036

[51] Int. Cl.⁴ ................................................ G11C 7/00
[52] U.S. Cl. ..................................... 365/203; 365/189
[58] Field of Search ............... 365/203, 205, 189, 190, 365/202

[56] References Cited

U.S. PATENT DOCUMENTS

| | | | |
|---|---|---|---|
| 3,949,385 | 4/1976 | Sonoda | 365/203 |
| 4,112,512 | 9/1978 | Arzubi et al. | 365/203 |
| 4,122,548 | 10/1978 | Heuber et al. | 365/203 |

Primary Examiner—Joseph A. Popek
Attorney, Agent, or Firm—Armstrong, Nikaido, Marmelstein & Kubovcik

[57] ABSTRACT

A semiconductor memory device comprises a memory cell array, a bit line charge-up circuit coupled to one of a plurality of pairs of bit lines from the memory cell array for initially charging up the one pair of bit lines to a first voltage which is lower than a power source voltage used to drive the semiconductor memory device, an active restore circuit coupled to the one pair of bit lines and a switching circuit coupled to the one pair of bit lines for disconnecting the one pair of bit lines into a first pair of bit line sections on the side of the memory cell array and a second pair of bit line sections on the side of the active restore circuit after the one pair of bit lines are initially charged up to the first voltage. The active restore circuit charges up one of the pair of bit line sections on the side of the active restore circuit to a second voltage which is higher than the first voltage depending on a datum read out from the memory cell array.

9 Claims, 5 Drawing Sheets

SEMICONDUCTOR MEMORY DEVICE

BACKGROUND OF THE INVENTION

The present invention generally relates to semiconductor memory devices, and more particularly to a semiconductor memory device such as a dynamic random access memory (DRAM) comprising one-transistor one-capacitor type memory cells, in which it is possible to reduce the power consumption compared to conventional semiconductor memory devices.

An example of a conventional semiconductor memory device generally comprises a memory cell array, a bit line charge-up circuit, a sense amplifier circuit, an active restore circuit and a column select circuit with respect to a pair of bit lines. The pair of bit lines from the memory cell array are coupled to each of the bit line charge-up circuit, the sense amplifier circuit, the active restore circuit and the column select circuit. The bit line charge-up circuit is used to initially charge the bit lines to a power source voltage. A datum (voltage) is read out from a memory cell within the memory cell array by use of the sense amplifier circuit which senses and amplifies the voltage read out via the bit lines. Hence, a small difference in the potentials at the bit lines is amplified and supplied to the active restore circuit. However, there is an inevitable decrease in the potential when the voltage is read out from the memory cell array by use of the sense amplifier circuit, and the active restore circuit is used to compensate for this decrease in the potential by amplification. Out of a plurality of such amplified signals from a plurality of active restore circuits, the column select circuit selectively passes a signal obtained from one pair of bit lines and supplies this signal to an external data file, for example, via a data bus.

However, a charge-up current or a discharge current in the pair of bit lines can be described by the following equation and is considerably large.

[Charge-up current (or discharge current)] = [(Potential at bit line) × (Capacitance)] / [Time]

Accordingly, in order to reduce the power consumption, semiconductor memory devices have been recently proposed in which the initial charge-up voltage is made less than or equal to one-half the power source voltage. When the initial charge-up voltage is one-half the power source voltage, the charge-up current becomes one-half that of the conventional semiconductor memory device described before.

But as will be described later on in the specification in conjunction with the drawings, when the initial charge-up voltage is reduced to less than or equal to one-half the power source voltage and the active restore circuit of the conventional semiconductor memory device is used as it is, it is extremely difficult to increase the potentials at the bit lines from this reduced charge-up voltage to the power source voltage. As a result, there are problems in that the power consumption of the semiconductor memory device cannot be reduced considerably without introducing undesirable effects on the operation of the semiconductor memory device.

SUMMARY OF THE INVENTION

Accordingly, it is a general object of the present invention to provide a novel and useful semiconductor memory device in which the problems described heretofore are eliminated.

Another and more specific object of the present invention is to provide a semiconductor memory device in which bit lines are initially charged up to a first voltage which is lower than a power source voltage and the bit lines are thereafter charged up to a second voltage which is higher than the first voltage. According to the semiconductor memory device of the present invention, the power consumption is reduced because the bit lines are initially only charged up to the first voltage. Furthermore, although the bit lines are initially only charged up to the first voltage, it is possible to positively charge up the bit line to the second voltage depending on a read out datum so that a normal operation of the semiconductor memory device is ensured.

Still another object of the present invention is to provide a semiconductor memory device comprising a memory cell array comprising memory cells, a plurality of pairs of bit lines which are coupled to the memory cells of the memory cell array, a bit line charge-up circuit coupled to one of the plurality of pairs of bit lines for initially charging up the one pair of bit lines from the memory cell array to a first voltage which is lower than a power source voltage used to drive the semiconductor memory device, an active restore circuit coupled to the one pair of bit lines and a switching circuit coupled to the one pair of bit lines for disconnecting the one pair of bit lines into a first pair of bit line sections on the side of the memory cell array and a second pair of bit line sections on the side of the active restore circuit after the one pair of bit lines are initially charged up to the first voltage, wherein the active restore circuit charges up one of the pair of bit line sections on the side of the active restore circuit to a second voltage which is higher than the first voltage depending on a datum read out from the memory cell array. According to the semiconductor memory device of the present invention, the power consumption of the semiconductor memory device is reduced and the normal operation of the semiconductor memory device is ensured.

A further object of the present invention is to provide a semiconductor memory device which further comprises another bit line charge-up circuit on the side of the active restore circuit for charging up the pair of bit line sections on the side of the active restore circuit to a third voltage which is greater than the first voltage and smaller than the second voltage, wherein the two bit line charge-up circuits are controlled independently by two different signals. According to the semiconductor memory device of the present invention, the charge-up of the bit line from the third voltage to the second voltage depending on the datum read out from the memory cell array can be performed at a high speed so that the semiconductor memory device is unaffected by a voltage fluctuation in the power source voltage.

Other objects and further features of the present invention will be apparent from the following detailed description when read in conjunction with the accompanying drawings.

DETAILED DESCRIPTION

Figure 1:
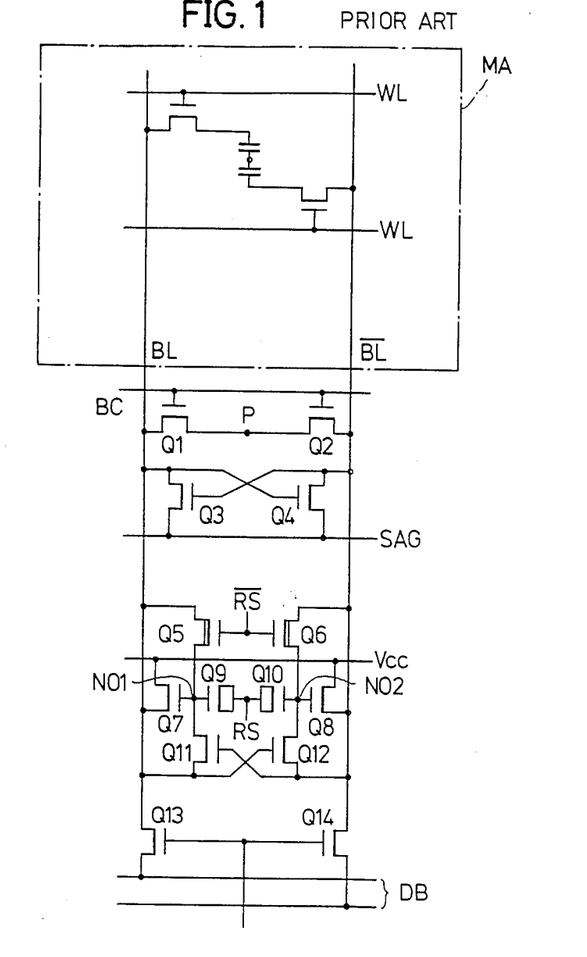
FIG. 1 is a circuit diagram showing an essential part of an example of the conventional semiconductor memory device.
Figure 2:
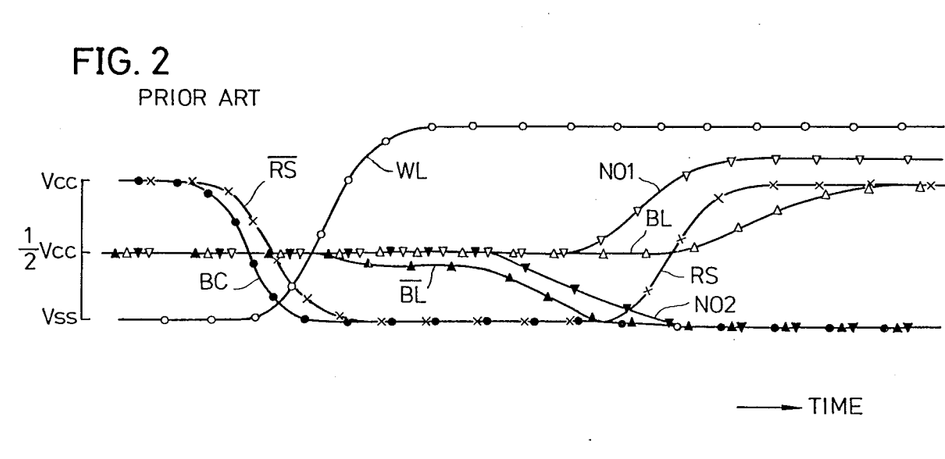
FIG. 2 is a diagram showing changes in the potentials with respect to time at various parts of the semiconductor memory device shown in FIG. 1.

First, description will be given with respect to the operation of an example of the conventional semiconductor memory device by referring to FIGS. 1 and 2. As shown in FIG. 1, the conventional semiconductor memory device generally comprises a memory cell array MA, a bit line charge-up circuit comprising transistors Q1 and Q2, a sense amplifier circuit comprising transistors Q3 and Q4, an active restore circuit comprising transistors Q5, Q6, Q7, Q8, Q9, Q10, Q11 and Q12 and a column select circuit comprising transistors Q13 and Q14. A pair of bit lines BL and $\overline{BL}$ from the memory cell array MA are coupled to each of the bit line charge-up circuit, the sense amplifier circuit, the active restore circuit and the column select circuit. Word lines WL are coupled to the memory cell array MA. A signal line BC is coupled to the bit line charge-up circuit, and a signal line SAG is coupled to the sense amplifier circuit. Signal lines RS and $\overline{RS}$ are coupled to the active restore circuit. In FIG. 1, Vcc denotes a positive power source voltage, NO1 and NO2 respectively denote nodes within the active restore circuit and DB denotes a data bus line.

The conventional sedmiconductor memory device shown in FIG. 1 employs the folded bit lines BL and $\overline{BL}$ in order to read out with a satisfactory sensitivity a small charge stored in a memory capacitor which is within the memory cell array MA and has a small capacitance.

When data are read out from the memory cell array MA by use of the same amplifier circuit, there is an inevitable decrease in the potential. The active restore circuit is provided to compensate for this decrease in the potential by amplification. The data amplified in the active restore circuit are supplied to the column select circuit which selectively passes a datum related to one pair of bit lines. The data selectively passed by the column select circuit is transmitted through the data bus line DB, amplified and supplied to a data file (not shown).

In the conventional semiconductor memory device shown in FIG. 1, the potential at a point P is Vcc and the bit lines BL and $\overline{BL}$ are initially charged up to the voltage Vcc by the bit line charge-up circuit. The datum or voltage read out from the memory cell array MA is obtained through these bit lines BL and $\overline{BL}$ which are charged up, and a small difference in the potentials at the bit lines BL and $\overline{BL}$ is amplified and converted into a signal. However, a charge-up current or a discharge current in the bit lines BL and $\overline{BL}$ is considerably large as may be seen from the following equation.

[Charge-up (or discharge) current] = [(Potential at bit line)×(Capacitance)]/[Time]

Accordingly, in order to reduce the power consumption of the semiconductor memory device, semiconductor memory devices have been recently proposed in which the charge-up voltage is made less than or equal to one-half the voltage Vcc. When the potential at the point P is Vcc/2 and the charge-up voltage is Vcc/2, the charge-up current becomes one-half that of the conventional semiconductor memory device described before.

However, problems occur when the charge-up voltage is made less than or equal to Vcc/2 and the active restore circuit shown in FIG. 1 is used as it is. Such problems will now be described in conjunction with FIG. 2. FIG. 2 shows changes in the potentials with respect to time at various parts of the semiconductor memory device shown in FIG. 1. In FIG. 2, the designations used in FIG. 1 are used to show the potentials at the various parts of the semiconductor memory device, and Vss denotes a ground voltage.

The potential at the point P is Vcc/2. Before the read-out is made form the memory cell array MA, the potentials at the signal lines BC and $\overline{RS}$ are respectively raised to Vcc. Hence, the transistors Q1 and Q2 of the bit line charge-up circuit are initially turned ON, and the potentials at the bit lines BL and $\overline{BL}$ are respectively reset to Vcc/2. At the same time, the transistors Q7 and Q8 of the active restore circuit are also turned ON, and the potentials at the nodes NO1 and NO2 are respectively reset to Vcc/2.

When the mode changes from a stand-by (or reset) mode to an active mode in which the read-out is made, the potentials at the signal lines BC and $\overline{RS}$ respectively decrease toward the ground voltage Vss, and the bit lines BL and $\overline{BL}$ assume floating states. When the potential at the word line WL increases, a small difference occurs between the potentials at the bit lines BL and $\overline{BL}$ due to a datum ("0" or "1") read out from the memory cell within the memory cell array MA. A signal corresponding to the read out datum is amplified by decreasing the potential at a common source point of the transistors Q1 and Q2 which constitute the sense amplifier circuit. The potential at only the bit line which becomes low decreases from Vcc/2 to Vss, and at the same time, the potential at one of the nodes NO1 and NO2 decreases to Vss. In the case shown in FIG. 2, the potential at the bit line $\overline{BL}$ decreases. Hence, the transistor Q12 within the active restore circuit is turned ON and the potential at the node NO2 decreases to Vss. However, the potential at the node NO1 is maintained to Vcc/2.

In this state, the potential at the signal line RS is increased so as to increase the potential at the node NO1 from Vcc/2 by the operation of the transistors Q9 and Q10. In actual practice, metal oxide semiconductor (MOS) diodes are used for the transistors Q9 and Q10.

Normally, the potential at the bit line must be zero when the datum is "0" and Vcc when the datum is "1". Hence, when the datum is "1", the bit line BL must be charged up from Vcc/2 to Vcc. In order to charge up the bit line BL from Vcc/2 to Vcc, it is necessary to increase the potential at the node NO1 and turn the transistor Q7 ON. In this case, it is necessary to increase the potential at the node NO1 to Vcc+Vr, where Vr denotes the threshold voltage of the transistor Q7. The potential at the line RS increases from Vss to Vcc, but the original potential at the node NO1 is Vcc/2. Accordingly, the potential at the node NO1 cannot be increased to Vcc+Vr with ease.

Generally, the capacitance added at the node NO1 must be small compared to the capacitance of the transistor Q9 which is actually a MOS diode. If the capacitance added at the node NO1 were large compared to the capacitance of the transistor Q9, the potential at the node NO1 will not reach a sufficiently large value even when the potential at the node NO1 is increased by the operation of the transistor Q9. Hence, in order to increase the potential at the node NO1 to the sufficiently large value, the capacitance and thus the size of the transistor Q9 (that is, the MOS diode) must be increased. However, since a plurality of active restore circuits are provided in accordance with the interval with which a plurality of pairs of bit lines are provided, it is impossible to relatively reduce the capacitance added at the node NO1 compared to the capacitance of the transistor Q9 by adding a large capacitance. Furthermore, when the large capacitance is added, the load becomes excessively large and a large voltage will be required to increase the potential at the node NO1.

For these reasons, it is extremely difficult to increase the potential at the node NO1 (or NO2) to over Vcc+Vr and charge up the bit line BL (or $\overline{BL}$) to Vcc.

Accordingly, the semiconductor memory device of the present invention is designed so that the bit lines are initially charged up to a first voltage which is lower than Vcc but it is possible to thereafter charge up the bit line to a second voltage which is higher than the first voltage depending on the read out datum, thereby making it possible to reduce the power consumption of the semiconductor memory device without introducing undesirable effects on the operation of the semiconductor memory device.

Figure 3:
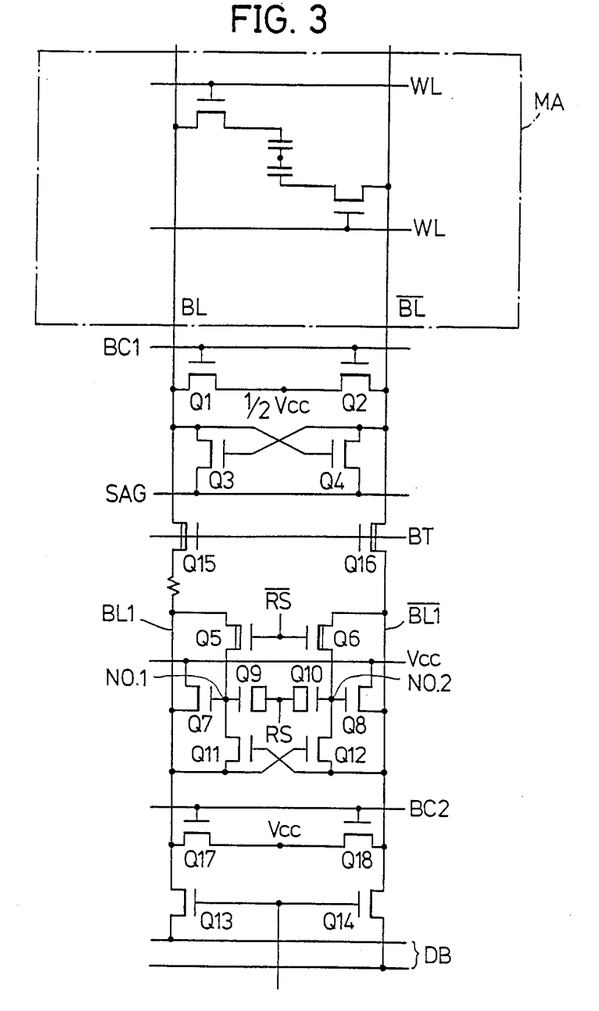
FIG. 3 is a circuit diagram showing an essential part of an embodiment of the semiconductor memory device according to the present invention.

FIG. 3 is a circuit diagram showing an essential part of an embodiment of the semiconductor memory device according to the present invention. In FIG. 3, those parts which are the same as those corresponding parts in FIG. 1 are designated by the same reference numerals, and description thereof will be omitted. The semiconductor memory device shown in FIG. 3 differs from the semiconductor memory device shown in FIG. 1 in that a switching circuit comprising transfer gate transistors Q15 and Q16 and a bit line charge-up circuit (hereinafter referred to as a second bit line charge-up circuit) comprising transistors Q17 and Q18 are additionally provided. The switching circuit is provided between the sense amplifier circuit comprising the transistors Q3 and Q4 and the active restore circuit comprising the transistors Q5 through Q12. The switching circuit separates the pair of bit lines into bit line sections BL and $\overline{BL}$ on the side of the memory cell array MA and bit line sections BL1 and $\overline{BL1}$ on the side of the active restore circuit. The second bit line charge-up circuit is used to charge up the bit line sections BL1 and $\overline{BL1}$ to Vcc−Vr. A signal line BC1 is coupled to the bit line charge-up circuit (hereinafter referred to as a first bit line charge-up circuit) comprising the transistors Q1 and Q2, and a signal line BC2 is coupled to the second bit line charge-up circuit. A signal line BT is coupled to the switching circuit.

Figure 4A:
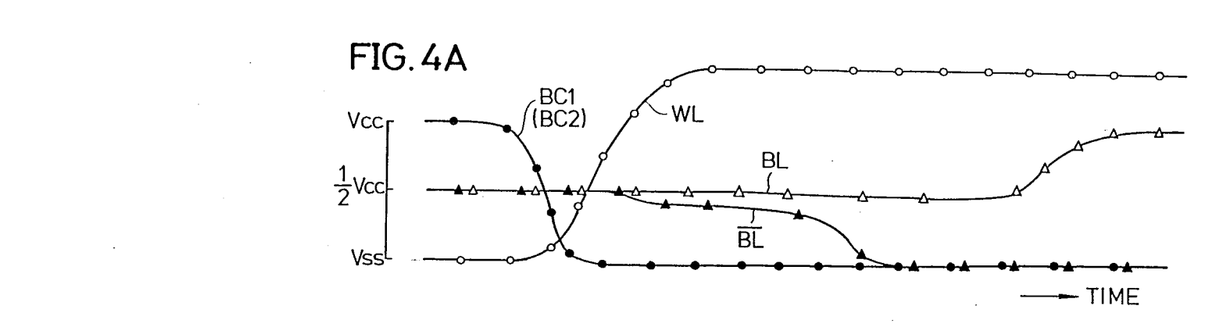
FIGS. 4A and 4B are diagrams showing changes in the potentials with respect to time at various parts of the semiconductor memory device shown in FIG. 3 for explaining the operation of a first embodiment of the present invention.
Figure 4B:
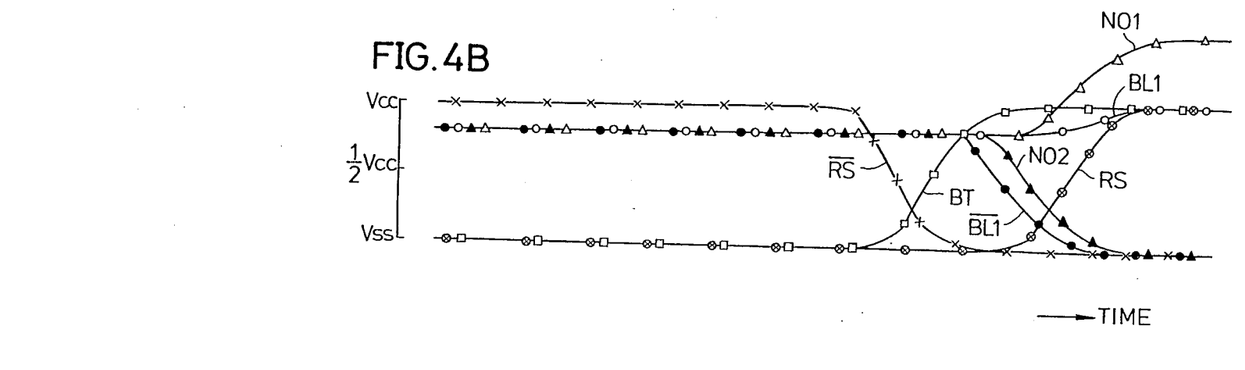

Description will now be given with respect to a first embodiment of the present invention by referring to FIGS. 3, 4A and 4B. FIGS. 4A and 4B show changes in the potentials with respect to time at various parts of the semiconductor memory device shown in FIG. 3 for explaining the operation of the first embodiment of the present invention. In FIGS. 4A and 4B, the designations used in FIG. 3 are used to show the potentials at the various parts of the semiconductor memory device, and Vss denotes the ground voltage. FIG. 4A shows the changes in the potentials at circuit parts on the side of the memory cell array MA, and FIG. 4A shows the changes in the potentials at circuit parts on the side of the active restore circuit.

In the stand-by mode of the first embodiment, the potentials at the signal lines BC1 and BC2 are respectively increased to Vcc, the bit line sections BL and $\overline{BL}$ are respectively charged up to Vcc/2 and the bit line sections BL1 and $\overline{BL1}$ are respectively charged up to Vcc−Vr. At the same time, the nodes NO1 and NO2 are charged up to Vcc−Vr because the potential at the line $\overline{RS}$ is Vcc. The fact that the potentials at the nodes N1 and N2 are Vcc−Vr and high leads to the advantages which will be described later. The transfer gate transistors Q15 and Q16 are turned OFF after the pair of bit lines, that is, the bit line sections BL, $\overline{BL}$, BL1 and $\overline{BL1}$ are initially charged up to Vcc/2. The bit line sections BL, $\overline{BL}$, BL1 and $\overline{BL1}$ assume floating states when the potential at the signal line BC1 is decreased from Vcc.

When the potential at the word line WL is increased, a datum read out from the memory cell within the memory cell array MA is obtained at the bit line sections BL and $\overline{BL}$. The potential at the bit line which is low decreases to Vss when the transistors Q3 and Q4 constituting the sense amplifier circuit are turned ON. When the potential at the signal line $\overline{RS}$ is decreased and the potential at the signal line BT is increased, the bit line sections BL and BL1 become connected and the bit line sections $\overline{BL}$ and $\overline{BL1}$ become connected.

In the first embodiment, when the potential at the signal line BT is increased after the sense amplifier circuit operates, the potential at the bit line section $\overline{BL}$ decreases to Vss. For this reason, the potential at the node NO2 is also Vss. On the other hand, the potential at the node NO1 is maintained to Vcc−Vr. Accordingly, when the potential at the signal line RS is increased from Vss to Vcc, the potential at the node NO1 becomes higher than than Vcc+Vr and it is thus possible to charge up the bit line sections BL and BL1 to Vcc via the transistor Q7.

The potential Vcc−Vr obtainable at the node NO1 is considerably high compared to the potential Vcc/2 obtainable in the conventional semiconductor memory device shown in FIG. 1. Due to this high potential at the node NO1, it is possible to charge up the bit line which is high at a high speed when the potential at the signal line RS is increased from Vss to Vcc.

According to the first embodiment, the semiconductor memory device is initially charged up to a first voltage which is lower than the power source voltage. Hence, the required charge-up current is small and the power consumption can be reduced effectively. Furthermore, after the semiconductor memory device is initially charged up, only the bit lines are charged up to a second voltage which is much higher than the first voltage so that the semiconductor memory device can operate normally. The bit line is charged up to the second voltage from a third voltage which is greater than the first voltage and is smaller than the second voltage, so that it is possible to positively charge up the bit line to the second voltage. For example, the first voltage is less than or equal to Vcc/2, the second voltage is equal to Vcc and the third voltage is equal to Vcc−Vr.

In the first embodiment described heretofore, the same signal is applied to the signal lines BC1 and BC2 which respectively control the first and second bit line charge-up circuits. However, different signals may be applied to the signal lines BC1 and BC2 so as to independently control the first and second bit line charge-up circuits.

Figure 5A:
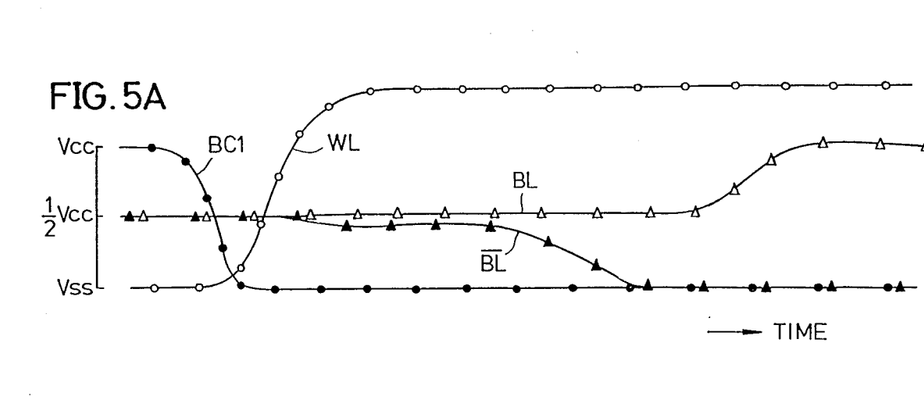
FIGS. 5A and 5B are diagrams showing changes in the potentials with respect to time at various parts of the semiconductor memory device shown in FIG. 3 for explaining the operation of a second embodiment of the present invention.
Figure 5B:
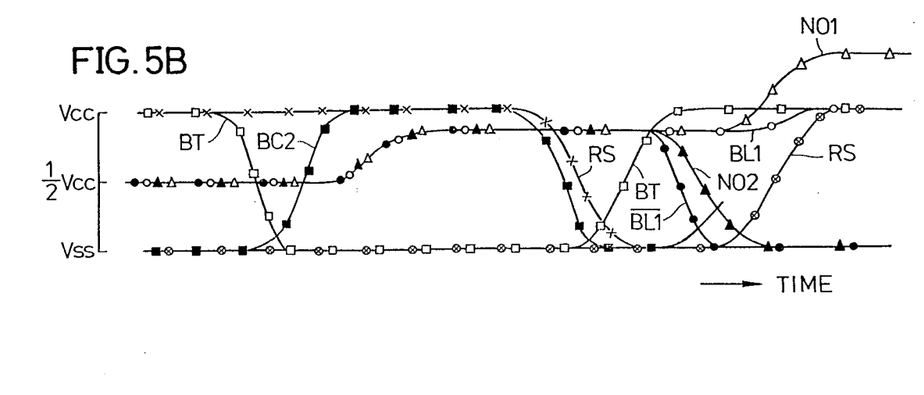

Next, description will be given with respect to a second embodiment of the present invention in which different signals are applied to the signal lines BC1 and BC2, by referring to FIGS. 3, 5A and 5B. FIGS. 5A and 5B show changes in the potentials with respect to time at various parts of the semiconductor memory device shown in FIG. 3 for explaining the operation of the second embodiment of the present invention. In FIGS. 5A and 5B, the designations used in FIGS. 4A and 4B are also used to show the potentials at the various parts of the semiconductor memory device. FIG. 5A shows the changes in the potentials at circuit parts on the side of the memory cell array MA, and FIG. 5B shows the changes in the potentials at circuit parts on the side of the active restore circuit.

In the second embodiment, the operation on the side of the memory cell array MA is essentially the same as that of the first embodiment, as may be seen by comparing FIGS. 4A and 5A. However, on the side of active restore circuit in the second embodiment, the potentials at the signal lines BT and $\overline{RS}$ are respectively increased to Vcc in the stand-by mode. Accordingly, the bit line sections BL, $\overline{BL}$, BL1 and $\overline{BL1}$ and the nodes NO1 and NO2 are respectively charged up to Vcc/2, and the semiconductor memory device is in a perfect stand-by mode.

When the mode of the semiconductor memory device changes to the active mode, the potential at the signal line BC1 decreases and the potential at the word line WL increases to obtain the datum via the bit lines. The read out datum is sensed and amplified in the sense amplifier circuit as in the first embodiment described before. At the same time, however, the potential at the signal line BT is decreased in the second embodiment and the potential at the signal line BC2 is increased while the read out datum is amplified in the sense amplifier circuit. Hence, the second embodiment differs from the first embodiment in that the potentials at the bit line sections BL1 and $\overline{BL1}$ and the nodes NO1 and NO2 are respectively increased from Vcc/2 to Vcc−Vr by decreasing the potential at the signal line BT and increasing the potential at the signal line BC2 while the read out datum is amplified in the sense amplifier circuit.

The rest of the operation of the second embodiment is basically the same as that of the first embodiment. That is, the potentials at the signal line $\overline{RS}$ and the signal line BC1 are respectively decreased, and the potential at the signal line BT is increased. As a result, the potential at the node NO2 becomes Vss and the potential at the node NO1 becomes Vcc−Vr. When the potential at the signal line RS is increased from Vss to Vcc, the potential at the node NO1 becomes over Vcc+Vr and the bit line sections BL and BL1 are respectively charged up to Vcc.

According to the second embodiment, it is possible to obtain effects which are the same as those obtainable in the first embodiment. Furthermore, the charge-up of the bit line to the power source voltage depending on the read out datum can be performed at a high speed according to the second embodiment.

The second embodiment is advantageous in that the semiconductor memory device is less affected by a voltage fluctuation in the power source voltage compared to the first embodiment. In other words, in the first embodiment described before, the potentials at the signal lines BC1 and BC2 fluctuate when there is a voltage fluctuation in the power source voltage.

Generally, the tolerance of the voltage fluctuation in the power source voltage is in the order of 5 (volts)±10 (%) in the case of the semiconductor memory device. When it is assumed that the power source voltage changes from 5.5 (volts) to 4.5 (volts), a similar change occurs in the potentials at the signal lines BC1 and BC2. On the other hand, the potentials at the nodes NO1 and NO2 and the bit line sections BL1 and $\overline{BL2}$ are respectively maintained to the charged up potentials of 5.5 (volts)−Vr. For this reason, after the fluctuation in the power source voltage occurs, the charged up potentials are in excess for the semiconductor memory device to operate at 4.5 (volts), and this excess charge may cause an erroneous operation of the semiconductor memory device of the first embodiment.

However, in the second embodiment, the charge-up time required to charge up the bit line sections BL1 and $\overline{BL1}$ and the nodes NO1 and NO2 to the potential Vcc−Vr by increasing the potential at the signal line BC2 to the power source voltage Vcc is extremely short as may be seen from FIG. 5B. The probability that the power source voltage fluctuates within this extremely short charge-up time is extremely small. Hence, the operation of the second embodiment is reliable even if the fluctuation in the power source voltage should occur.

Further, the present invention is not limited to these embodiments, but various variations and modifications may be made without departing from the scope of the present invention.

What is claimed is:

1. A semiconductor memory device, comprising:
a pair of bit lines comprising first and second sections;
switching means coupled between said first and second sections of said pair of bit lines;
a plurality of memory cells coupled to said first section of said pair of bit lines;
a bit line charge-up circuit coupled to said first section of said pair of bit lines for charging up said first section to a first voltage;
an active restore circuit coupled to said second section of said pair of bit lines for charging up a selected one of said pair of bit lines to a second voltage higher than said first voltage in dependence on a datum read out from a selected one of said memory cells; and
charge-up means coupled to said second section of said pair of bit lines for charging up said second section to a third voltage higher than said first voltage level while said second section of said pair of bit lines is disconnected from said first section of said pair of bit lines by said switching means.

2. A semiconductor memory device as claimed in claim 1, wherein said first voltage is substantially equal to half of the power source voltage used to drive the semiconductor memory device.

3. A semiconductor memory device as claimed in claim 1, wherein said second voltage is substantially equal to the power source voltage used to drive the semiconductor memory device.

4. A semiconductor memory device as claimed in claim 1, wherein said charge-up means comprises a plurality of charge-up transistors having a threshold voltage, and said third voltage is substantially equal to the power source voltage used to drive the semiconductor memory device minus said threshold voltage.

5. A semiconductor memory device as claimed in claim 4, wherein said first voltage is substantially equal to half of the power source voltage and said second voltage is substantially equal to the power source voltage.

6. A semiconductor memory device as claimed in claim 1, wherein said bit line charge-up circuit and said charge-up means are controlled by the same signals.

7. A semiconductor memory device as claimed in claim 1, wherein said bit line charge-up circuit and said charge-up means are independently controlled by different signals.

8. A semiconductor memory device as claimed in claim 1, wherein said bit line charge-up circuit and said charge-up means charge up said first and second sections of said pair of bit lines, respectively, during a stand-by mode of the semiconductor memory device.

9. A semiconductor memory device as claimed in claim 1, wherein said bit line charge-up circuit charges up said first section of said pair of bit lines during a stand-by mode of the semiconductor memory device and said charge-up means charges up said second section of said pair of bit lines after the initiation of a read out operation.

* * * * *